(12) United States Patent
Dumitru et al.

(10) Patent No.: US 8,519,449 B2
(45) Date of Patent: Aug. 27, 2013

(54) THIN-FILM TRANSISTOR BASED PIEZOELECTRIC STRAIN SENSOR AND METHOD

(75) Inventors: Viorel-Georgel Dumitru, Prahova (RO); Cornel Cobianu, Bucharest (RO); Stefan-Dan Costea, Bucharest (RO); Bogdan-Catalin Serban, Bucharest (RO)

(73) Assignee: Honeywell International Inc., Morristown, NJ (US)

( * ) Notice: Subject to any disclaimer, the term of this patent is extended or adjusted under 35 U.S.C. 154(b) by 378 days.

(21) Appl. No.: 12/842,298

(22) Filed: Jul. 23, 2010

(65) Prior Publication Data

US 2011/0049579 A1 Mar. 3, 2011

Related U.S. Application Data

(60) Provisional application No. 61/236,788, filed on Aug. 25, 2009.

(51) Int. Cl.
 *H01L 29/84* (2006.01)
(52) U.S. Cl.
 USPC .......................................... 257/254; 257/295
(58) Field of Classification Search
 USPC ................................. 257/254, 295
 See application file for complete search history.

(56) References Cited

U.S. PATENT DOCUMENTS

| 7,253,488 | B2 | 8/2007 | Zhan et al. | |
|---|---|---|---|---|
| 7,278,324 | B2 | 10/2007 | Smits et al. | |
| 7,302,856 | B2 | 12/2007 | Tang et al. | |
| 7,932,511 | B2 * | 4/2011 | Duan et al. | 257/9 |
| 8,035,100 | B2 * | 10/2011 | Yoon et al. | 257/43 |
| 2004/0053431 | A1 * | 3/2004 | Chang et al. | 438/30 |
| 2005/0034529 | A1 | 2/2005 | Tang et al. | |
| 2007/0272922 | A1 | 11/2007 | Kim et al. | |
| 2007/0278600 | A1 | 12/2007 | Zhan et al. | |
| 2008/0067618 | A1 | 3/2008 | Wang et al. | |
| 2008/0250863 | A1 | 10/2008 | Moore | |
| 2009/0127977 | A1 * | 5/2009 | So et al. | 310/322 |
| 2009/0206332 | A1 * | 8/2009 | Son et al. | 257/43 |

OTHER PUBLICATIONS

Zhou, J. et al., "Flexible Piezotronic Strain Sensor," *Nano Letters* (2008) 8(9):3035-3040.

(Continued)

*Primary Examiner* — David Vu
*Assistant Examiner* — Brandon Fox
(74) *Attorney, Agent, or Firm* — Kermit D. Lopez; Luis M. Ortiz; Kevin Sooles

(57) ABSTRACT

A piezoelectric strain sensor and method thereof for detecting strain, vibration, and/or pressure. The sensor incorporates a sequence of piezoelectric and semiconductor layers in a thin-film transistor structure. The thin-film transistor structure can be configured on a flexible substrate via a low-cost fabrication technique. The piezoelectric layer generates an electric charge resulting in a modulation of a transistor current, which is a measure of external strain. The sensor can be formed as a single gate field-effect piezoelectric sensor and a dual gate field-effect piezoelectric sensor. The semiconductor layer can be configured from a nanowire array resulting in a metal-piezoelectric-nanowire field effect transistor. The single and dual gate field-effect piezoelectric sensor offer increased sensitivity and device control due to the presence of the piezoelectric layer in the transistor structure and low cost manufacturability on large area flexible substrates.

14 Claims, 9 Drawing Sheets

(56) References Cited

OTHER PUBLICATIONS

Akiyama, M. et al., "Ultrahigh temperature vibration sensors using nitride thin films and W/Ru multilayer electrodes," *Applied Physics Letters* (2005) 86:022106.

Akiyama, M. et al., "Flexible piezoelectric pressure sensors using oriented aluminum nitride thin films prepared on polyethylene terephthalate films," *Journal of Applied Physics* (2006) 100:114318.

Lim, H. C. et al., "Flexible membrane pressure sensor,"*Sensors and Actuators A* (2005) 119:332-335.

Loh, K. J. et al., "Multifunctional layer-by-layer carbon nanotube-polyelectrolyte thin films for strain and corrosion sensing," *Smart Mater. Struct.* (2007) 16:429-438.

Ongstad, A. P. et al., "High-temperature performance in ~4 μm type-II quantum well lasers with increased strain," *Journal of Applied Physics* (2002) 92(10):5621-5626.

No, Y.-Y., et al., "Ink-jet printed ZnO nanowire field effect transistors," *Applied Physics Letters* (2007) 91:043109.

Vaillancourt, J. et al., "All ink-jet-printed carbon nanotube thin-film transistor on a polymide substrate with an ultrahigh operating frequency over 5 GHz," *Applied Physics Letters* (2008) 93:243301.

Wu, Y-R. et al., "Metal piezoelectric semiconductor field effect transistors for piezoelectric strain sensors," *Applied Physics Letter* (2004) 85(7):1223-1225.

Wu, Y-R. et al., "Polar Heterostructure for Multifunction Devices: Theoretical Studies," *IEEE Transactions on Electron Devices* (2005) 52(2):284-293.

Zhou, L. et al., "Flexible Substrate Micro-Crystalline Silicon and Gated Amorphous Silicon Strain Sensors," *IEEE Transactions on Electron Devices* (2005) 53(2):380-385.

Zhu, Z.-T. et al., "Spin on dopants for high-performance single-crystal silicon transistors on flexible plastic substrates," *Applied Physics Letters* (2005) 86:133507.

\* cited by examiner

THIN-FILM TRANSISTOR BASED PIEZOELECTRIC STRAIN SENSOR AND METHOD

CROSS-REFERENCE TO PROVISIONAL APPLICATION

This application claims the benefit of priority based on U.S. Provisional Patent Application Ser. No. 61/236,788 filed Aug. 25, 2009, entitled "Thin-Film Transistor Based Piezoelectric Strain Sensor and Method." The above-referenced provisional patent application is hereby incorporated by reference herein in its entirety.

TECHNICAL FIELD

Embodiments are generally related to sensor devices and components. Embodiments are also related to strain sensors that detect strain, vibration, force, and/or pressure. Embodiments are additionally related to the fabrication of strain sensors.

BACKGROUND OF THE INVENTION

Strain sensors are widely utilized for measuring and monitoring strain, pressure, force, and/or vibration in certain structures in order to provide inspection and flaw detection associated with such structures. Strain sensors can detect the magnitude of stress and load in various industrial and commercial applications. Examples of such applications include structural health monitoring applications such as industrial equipment condition monitoring, pipe and tank monitoring in oil and chemical industries, turbine engines, and in medical applications, to name a few.

A piezoelectric strain sensor takes advantage of the piezoelectric effect to measure pressure, acceleration, strain, and/or force by converting signals indicative of such conditions into electrical signals. The majority of prior art strain sensors are not suitable for manufacturing on a flexible substrate. Such strain sensors, if based on piezoelectric materials, also require complex electronics for collecting the sensor signal and operate with a low sensitivity. Traditional piezoresistive strain sensors have either a very low sensitivity (e.g., metallic sensors) or large power consumption (e.g., semiconductor piezoresistive sensors). Furthermore, the cost for manufacturing such sensors on a substrate increases the complexity of the resulting system and may result in a reduction in reliability.

Based on the foregoing, it is believed that a need exists for an improved field-effect piezoelectric strain sensor apparatus for detecting strain, vibration, and/or pressure. A need also exists for an improved method for fabricating the strain sensor apparatus on a flexible substrate by a low cost fabrication technique, as described in greater detail herein.

BRIEF SUMMARY

The following summary is provided to facilitate an understanding of some of the innovative features unique to the embodiments and is not intended to be a full description. A full appreciation of the various aspects of the embodiments disclosed herein can be gained by taking the entire specification, claims, drawings, and abstract as a whole.

It is, therefore, one aspect of the disclosed embodiments to provide for improved sensor devices and components.

It is another aspect of the disclosed embodiments to provide for an improved field-effect piezoelectric strain sensor apparatus for detecting strain, vibration, force, and/or pressure.

It is a further aspect of the disclosed embodiments to provide for an improved method for fabricating a strain sensor apparatus on a flexible substrate utilizing a low cost fabrication technique.

The aforementioned aspects and other objectives and advantages can now be achieved as described herein. A piezoelectric strain sensor apparatus and method for detecting strain, force, vibration, and/or pressure is disclosed. The apparatus incorporates a sequence of piezoelectric (e.g., AlN or PZT) and semiconductor layers arranged to form a thin-film transistor structure. The thin-film transistor structure can be configured on a flexible substrate via a low cost fabrication technique. The piezoelectric layer generates an electric charge that induces a modulation of a transistor current representing a measure of an external strain.

The apparatus can be formed as a single gate field-effect piezoelectric sensor and/or a dual gate field-effect piezoelectric sensor. The semiconductor layer (e.g. Si, $SnO_2$, $In_2O_3$, ZnO, InN, AlInN, etc.) can be formed from a nanowire array, resulting in a metal-piezoelectric-nanowire field-effect transistor. Such a single and dual gate field-effect piezoelectric sensor configurations offer increased sensitivity and device control (i.e., dual gate configuration) due to the presence of the piezoelectric layer in the transistor structure and a low cost manufacturability with respect to the large area flexible substrate.

The sensing structure can be configured on substrates such as, for example, metal foil, silicon, silicon carbide, sapphire, etc., which are suitable for use in harsh environments and high temperature applications. The sensing structure can also be configured on plastic substrates which are suitable for use, for example, in medical applications. A metallic gate region can be deposited between a source region and a drain region. A suitable voltage supply can be connected between the gate region and the source region. The apparatus utilizes a separate sensitive gate piezoelectric material (e.g., electrical isolator) for generating an electric charge.

In field-effect transistor-based strain sensors, the current flows through the semiconductor layer and the strain/pressure/force/vibration alters the transistor current directly. Hence, the apparatus requires much simpler reading electronics for collecting the sensor signal as compared to traditional piezoelectric sensors and consumes less power as compared to traditional piezoresistive sensors. The apparatus also possesses improved sensitivity due to the presence of the strain/pressure/force/vibration sensitive piezoelectric layer in the metal-piezoelectric-semiconductor thin-film transistor.

BRIEF DESCRIPTION OF THE DRAWINGS

The accompanying figures, in which like reference numerals refer to identical or functionally-similar elements throughout the separate views and which are incorporated in and form a part of the specification, further illustrate the embodiments and, together with the detailed description, serve to explain such embodiments.

DETAILED DESCRIPTION

The particular values and configurations discussed in these non-limiting examples can be varied and are cited merely to illustrate at least one embodiment and are not intended to limit the scope thereof.

Figure 1:
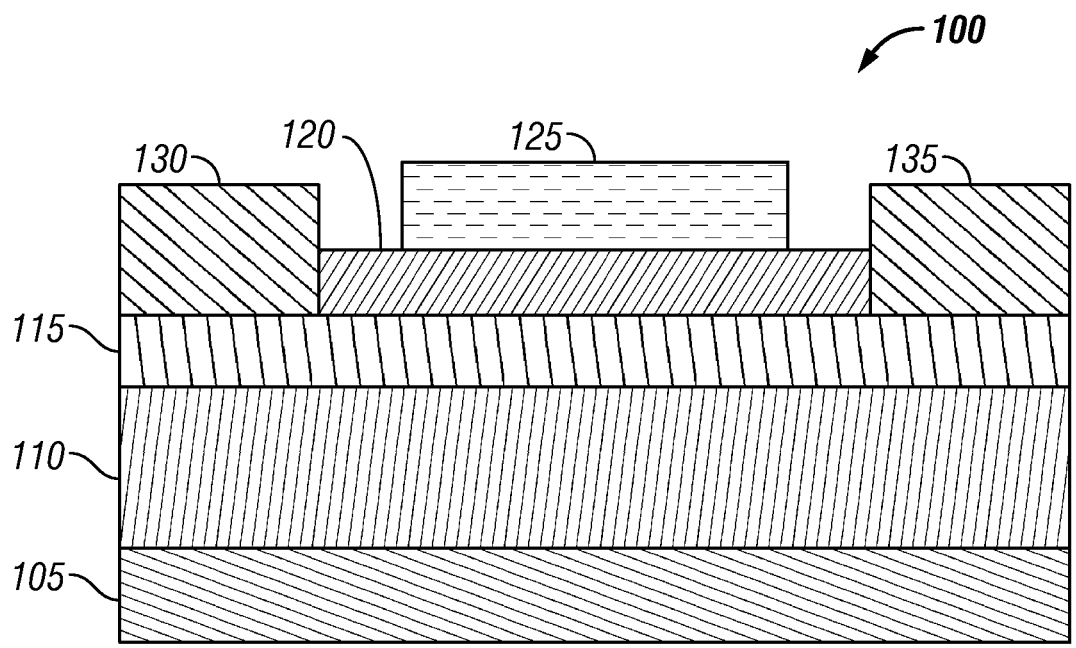
FIG. 1 illustrates a cross-sectional view of a field-effect piezoelectric strain sensor apparatus, in accordance with an embodiment.

FIG. 1 illustrates a cross-sectional view of a field-effect piezoelectric strain sensor 100, in accordance with the disclosed embodiments. The field-effect piezoelectric strain sensor 100 can be mounted and subjected to a strain in order to sense force, pressure, strain, acceleration, displacement, or any other parameter of interest by suitable coupling of the parameter to generate the strain required. The sensor 100 incorporates a sequence of thin-films of piezoelectric layer 110 and semiconductor layer 115 in order to form a thin-film transistor (TFT) structure. The piezoelectric layer 110 and the semiconductor layer 115 can be deposited on a flexible substrate 105 by a low cost fabrication technique. The apparatus 100 may be, for example, mounted on or integrally formed on the flexible substrate 105 to sense pressure, or a cantilever beam to sense force, displacement, or acceleration. The flexible substrate 105 described herein may be configured from a material such as, for example, metallic foil or plastic, depending upon design considerations. It can be appreciated that other types of materials may be utilized in place of the suggested material.

A metallic gate layer 125 can be deposited on a separate, isolator layer 120. Isolator layer 120 may be a "pure" gate dielectric layer 120 (like SiO2, SiON, etc) of a traditional MOSFET transistor or on a sensitive wide band gap piezoelectric layer 120 acting as an piezoelectric gate dielectric between the metallic gate layer 125 and the semiconductor layer 115 (as per a layer sequence of Metal-Oxide Semiconductor structure(s), specific to field effect MOS transistors), so that the electric current between the source 130 and the drain 135 can move through one or more surface channels of the semiconductor layer 115 that can be controlled by the field effect due to voltage applied at gate 125 and modulated by the charge created by the strain in the piezoelectric layer 110 and in the piezoelectric gate dielectric layer 120. Here, it is important to clarify the fact that the source and drain regions are metal layers that create an ohmic contact to the semiconductor layer 115. Note that as utilized herein the term "metal gate layer" may refer to a "maximum one metal gate layer" and/or a "zero gate metal layer" and/or other similar structures.

A suitable gate voltage can be applied between the gate region 125 and the source region 130. When the entire structure is mechanically stressed, the piezoelectric layer 110 and the piezoelectric gate dielectric 120 are mechanically stressed and a change in charge density at the surface of the piezoelectric layers 110 and 120 may appear which will alter by field effect the output drain current flowing through the semiconductor layer 115 of the apparatus 100 in order to provide an output that is an analog of the amount of stress or strain applied. The strain-sensing thin-film transistor can be configured as a special type of dual gate field-effect transistor in which the current conduction between the source region 130 and the drain region 135 through one or more channel regions of the semiconductor 115 is controlled by a gate voltage applied at the gate electrode 125 (i.e., this is the first gate) and further modulated by the strain in the piezoelectric layers 110 and 120.

The piezoelectric layer 110 generates electrical charges and an associated electric field at the interface with the semiconductor layer 115, which can be considered the second gate. Such a strain-sensing thin-film transistor structure can be utilized in a wide variety of electronic applications and is suitable to be configured on the flexible substrate 105 via a low cost fabrication technique. Note that the field-effect piezoelectric strain sensor apparatus 100 discussed herein can function as a virtual dual gate field-effect piezoelectric sensor because charges may be created by the field-effect at both interfaces of the semiconductor layer 115 due to the gate voltage and the piezoelectric effect in both 110 layer and 120 (e.g., when the layer 120 is a piezoelectric material), respectively.

Figure 2:
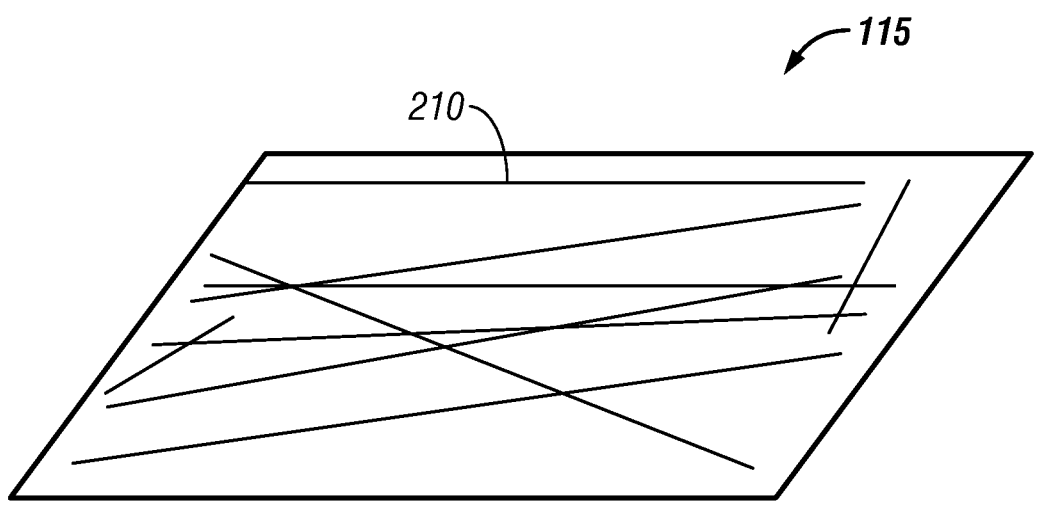
FIG. 2 illustrates a perspective view of a semiconductor layer, in accordance with an embodiment.

FIG. 2 illustrates a perspective view of a semiconductor layer 115, in accordance with an embodiment. The semiconductor layer 115 can be provided in the form of a semiconductor nanowire array 210, as depicted in FIG. 2. The semiconductor layer 115 can be configured from a nanowire and/or a nanotube material resulting in a metal-piezoelectric-nanowire field effect transistor (NW-FET). The nanowire or nanotube semiconductor layer 115 described herein may be configured from a material such as, for example, Si, GaAs, GaN, $SnO_2$, $In_2O_3$, ZnO, InN, AlInN and so forth or, for example, an array of CNT (carbon nanotubes), depending upon design considerations. Carbon nanotubes are generally large molecules of pure carbon that are long and thin and shaped like tubes, e.g., approximately 1-3 nanometers (1 nm=1 billionth of a meter) in diameter, and hundreds to thousands of nanometers long. As individual molecules, nanotubes are 100 times stronger-than-steel and one-sixth its weight. Some carbon nanotubes can be extremely efficient conductors of electricity and heat; depending on their configuration, some act as semiconductors.

It can be appreciated, of course, that other types of materials may be utilized in place of such suggested materials. In some embodiments, for example, the disclosed semiconductor layer 115 may be configured from materials having piezoelectric properties such as, for example, GaN, GaAs, ZnO, InN, and/or AlInN. The sensing effect can be further enhanced by the additional charge generated in such semiconductors themselves, due to the external strain to be detected.

Figure 3:
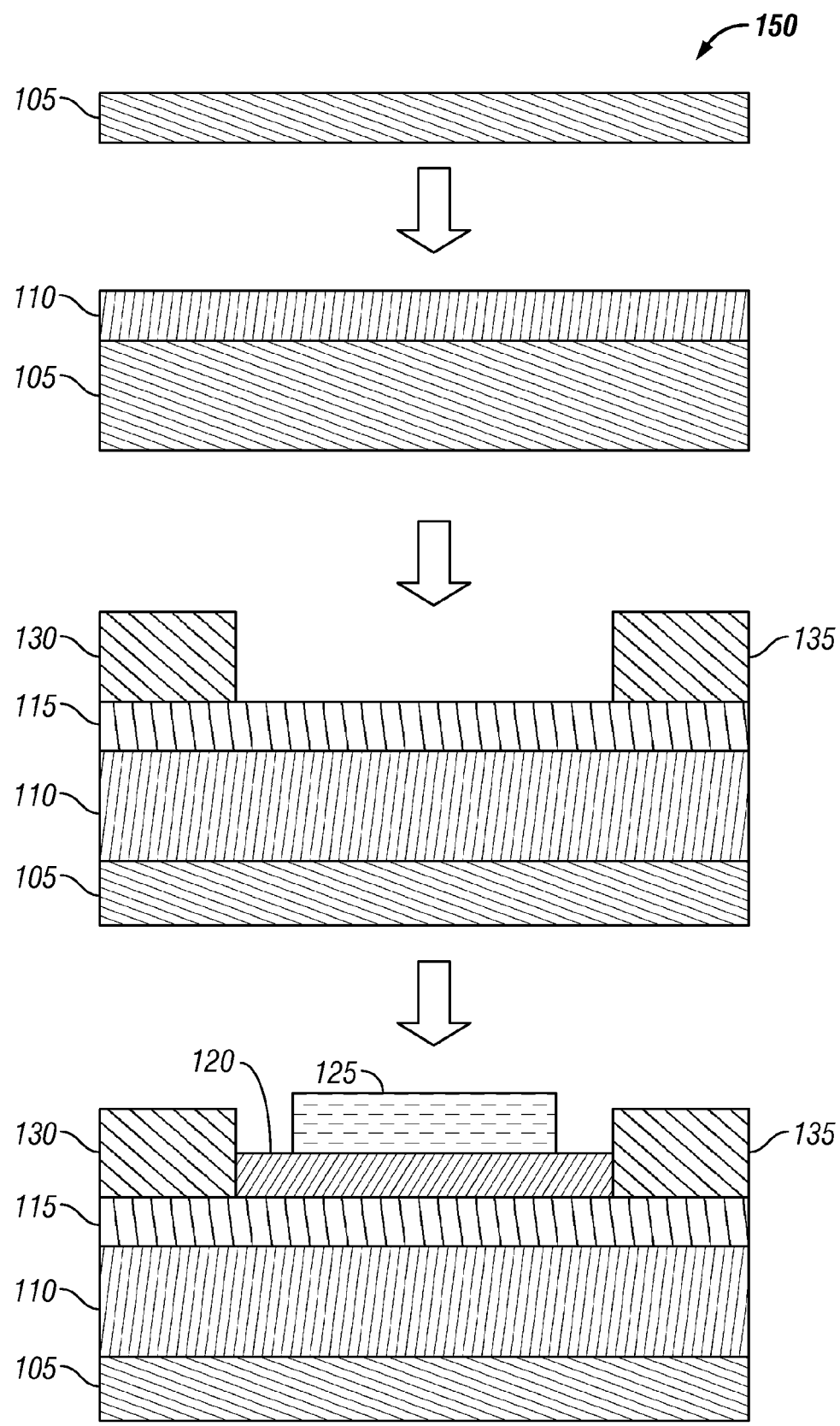
FIG. 3 illustrates a fabrication process associated with the field-effect piezoelectric strain sensor apparatus shown in FIG. 1, in accordance with an embodiment.

FIG. 3 illustrates a fabrication process 150 associated with the field-effect-based piezoelectric strain sensor 100 shown in FIG. 1, in accordance with the disclosed embodiments. Note that in FIGS. 1-10, identical or similar blocks are generally indicated by identical reference numerals. The thin-film strain sensing-transistor or nanowire/nanotube transistor structure can be realized by well known methods as described below. The piezoelectric layer 110 can be deposited on the flexible substrate 105 by, for example, a sputtering process. The semiconductor layer 115 can be realized by such a sputtering process. Sputtering is a process whereby atoms are ejected from a solid target material due to bombardment of the target by energetic ions and then deposited on surrounding surfaces, and this method is commonly utilized for thin-film deposition at low temperatures. Various nanowire and/or nanotube arrays 210 can be deposited utilizing a printing technology. In the case of flexible substrates withstanding higher temperatures around 350-650 degrees C., the liquid phase-based technologies, like printed technologies, can be also used for the preparation of the poly (nano) crystalline semiconductor layers.

The piezoelectric layer 110, acting in this configuration as the second gate, may be composed of any suitable piezoelectric material. Types of materials that may be utilized to form the piezoelectric layer 110 can include, but are not limited to, lead, zirconate titanate (PZT), and aluminum nitride (AlN) film. In one embodiment, the piezoelectric layer 110 may comprise a highly c-axis oriented polycrystalline AlN piezoelectric film. It can be appreciated that other types of materials like polycrystalline GaN, ZnO, or GaAs may be utilized in place of the suggested material. Metal contacts for source 130, drain 135, and gate can be configured utilizing a standard lithographic and deposition technology and/or via a printing technology. The piezoelectric layer 110 lead zirconate titanate (PZT) and other similar mono, bi- or tri-component of metal oxide layers can be prepared starting from sol-gel technology principles and selectively deposited on the substrate by a printing technology utilizing a high temperature resistant substrate such as, for example, a metal foil.

Figure 4:
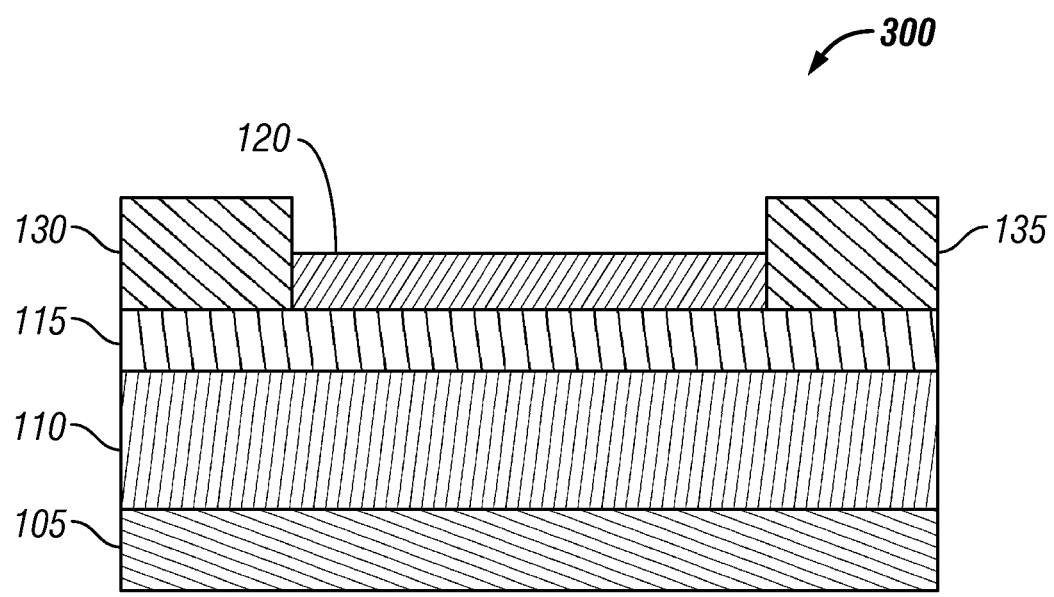
FIG. 4 illustrates a cross-sectional view of a field-effect piezoelectric strain sensor apparatus, in accordance with an embodiment.
Figure 5:
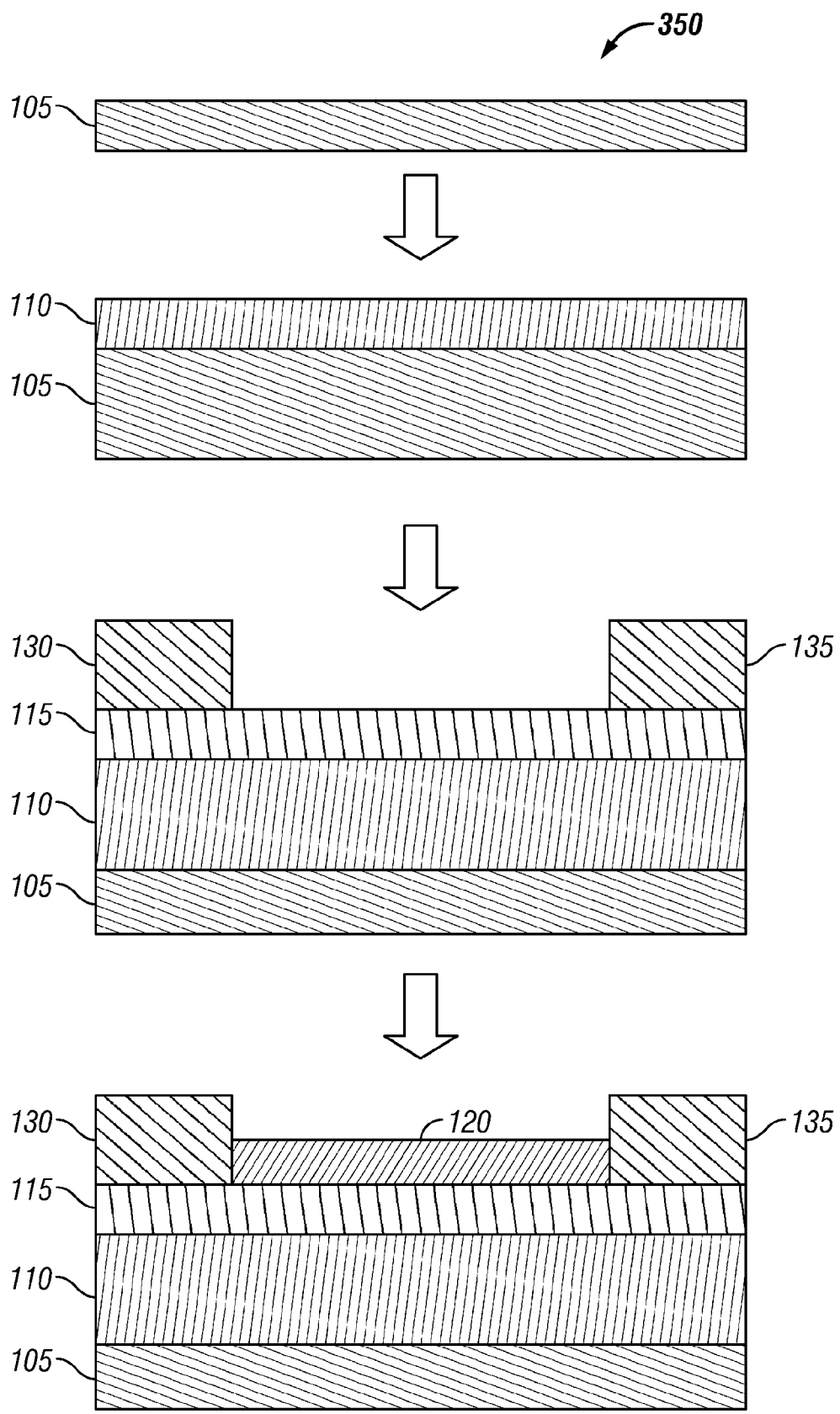
FIG. 5 illustrates a fabrication process associated with the field-effect piezoelectric strain sensor apparatus shown in FIG. 4, in accordance with an embodiment.

FIG. 4 illustrates a cross-sectional view of a field-effect piezoelectric strain sensor 300, in accordance with an embodiment. The field-effect piezoelectric strain sensor 300 is a gateless field effect transistor as it does not have a separate metallic gate electrode integrated in its structure. A field effect can be created at the interface between the piezoelectric layer 110 and semiconductor layer 115 due to the piezoelectric induced charge. The piezoelectric layer 110 generates an electric charge that induces a modulation of a transistor current, which is a measure of an external strain. The fabrication process 350 associated with the field-effect piezoelectric strain sensor 300 is illustrated in FIG. 5. The piezoelectric layer 110 can be deposited on the flexible substrate 105 by a sputtering process. The semiconductor layer 115 can be realized by a sputtering process and various nanowire and/or nanotube arrays 210 can be deposited by a printing technology.

The patterned metal contacts may be configured utilizing a standard lithography and deposition technology. Again, the layer 120 can be either a SiO2 layer or a wide band gap piezoelectric layer, acting as a virtual gate dielectric layer. If the layer 120 is a wide band gap piezoelectric layer, this can generate charges due to external strain and correspondingly field effect in the semiconductor layer 115. Thus, a metal gateless, but a virtual dual "gate" MOSFET based strain sensor is obtained. Again, for higher temperature flexible substrates (e.g., metal foils), one, may utilize printing technologies for depositing semiconducting micro and nano crystalline semiconductor layers 110 or, in more detail, sol-gel technologies may be employed for liquid-phase synthesis combined with screen printing or direct printing for selectively depositing solid piezoelectric layers 110 such as PZT, after the specific thermal treatments for liquid-gel-solid phase transitions are performed.

Figure 6:
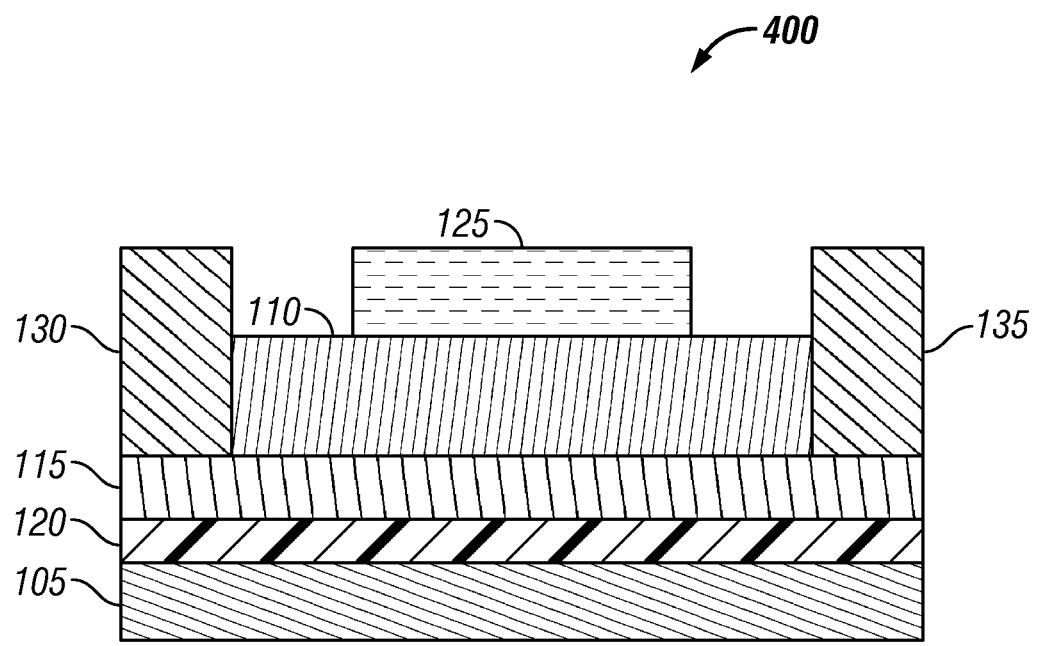
FIG. 6 illustrates a cross-sectional view of a field-effect piezoelectric strain sensor apparatus, in accordance with an embodiment.
Figure 7:
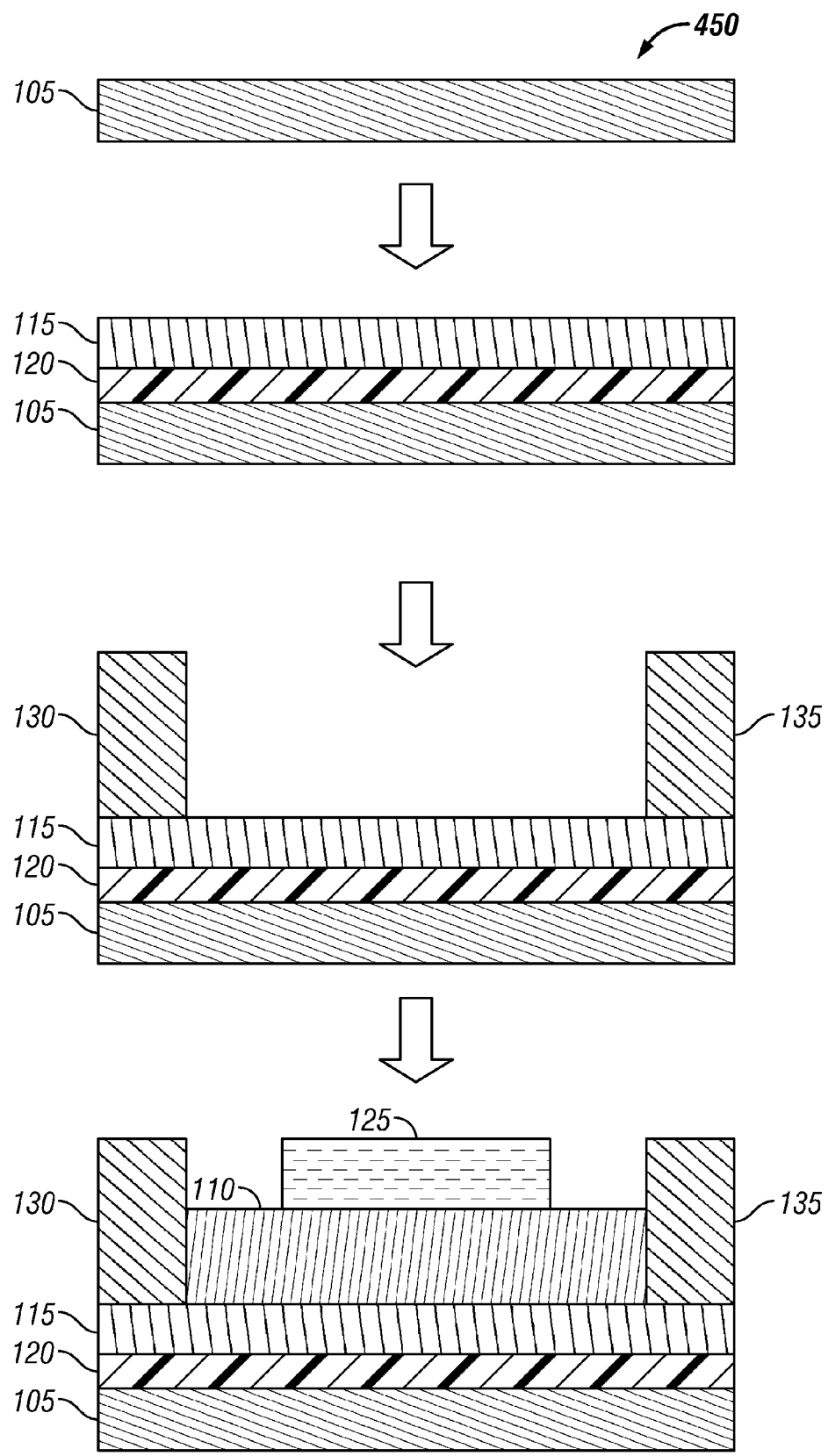
FIG. 7 illustrates a fabrication process associated with the field-effect piezoelectric strain sensor apparatus shown in FIG. 6, in accordance with an embodiment.

FIG. 6 illustrates a cross-sectional view of a field-effect piezoelectric strain sensor 400, in accordance with the disclosed embodiments. The field effect transistor strain sensor 400 comprises the piezoelectric layer 110, the layer of semiconductor material 115 constituting the channel for majority charge carrier flow between the source 130 and drain region 135, the conductivity of the channel being controlled by the voltage applied between the gate region 125 and the source 130, wherein the gate is overlying the channel between the source 130 and drain regions 135. When subjected to a strain, the resistance of one or more conducting channels in the semiconductor layer 115 changes according to the field effect generated by the electric charges in the layer 110, which are proportional to the amount of the externally applied strain. Again, if the dielectric layer 120, now located directly over the substrate 105, is replaced by a wide band gap piezoelectric layer acting as dielectric layer 120, then the sensing effect is augmented again due to the dual gate MOSFET operation of the strain sensor. The fabrication process 450 associated with the strain sensor 400 is illustrated in FIG. 7.

Figure 8:
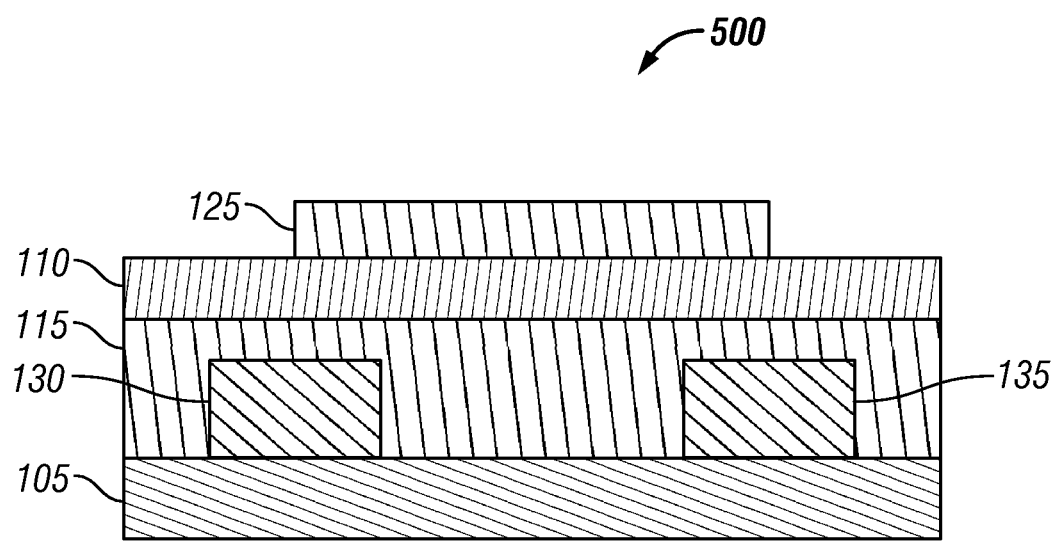
FIG. 8 illustrates a cross-sectional view of a field-effect piezoelectric strain sensor apparatus, in accordance with an embodiment.

FIG. 8 illustrates a cross-sectional view of a field-effect piezoelectric strain sensor 500, in accordance with an embodiment. Again, as a reminder, in FIGS. 1-10, identical or similar blocks are generally indicated by identical reference numerals. In the sensing structure, depicted in FIG. 8, a "pure" dielectric layer is not included as a part of the sensor fabrication. The substrate 105 should be an electrical isolator material so that the semiconductor layer to be directly deposited on that substrate still offers adequate electrical and sensing operations.

The sensor 500 that includes the disclosed field-effect piezoelectric sensor structure generally controls the flow of electrons from the source region 130 to the drain region 135 by affecting the size and shape of the conductive channel created and influenced by voltage applied across from the gate region 125 to the source region 130. The conductive channel is the "stream" through which electrons flow from the source region 130 to the drain region 135. Once the strain is directly applied in the transistor structure, the charge generation caused by the strain acting on the piezoelectric layer can affect the drain-source current by its associated field effect.

In the case of a semiconducting piezoelectric layer 115, as described, the tandem of the piezoelectric layer 110 and the semiconducting piezoelectric layer 115 can form a kind of strain-sensing MOSFET, wherein in addition to the MOSFET effect, a bimorph effect can be obtained on the piezoelectric dual layers, deposited one over the other, due to the fact that when the entire sensing structure bends or is subject to bending, one layer is under compression while the other layer stacked directly thereon is under tension and vice versa.

Figure 9:
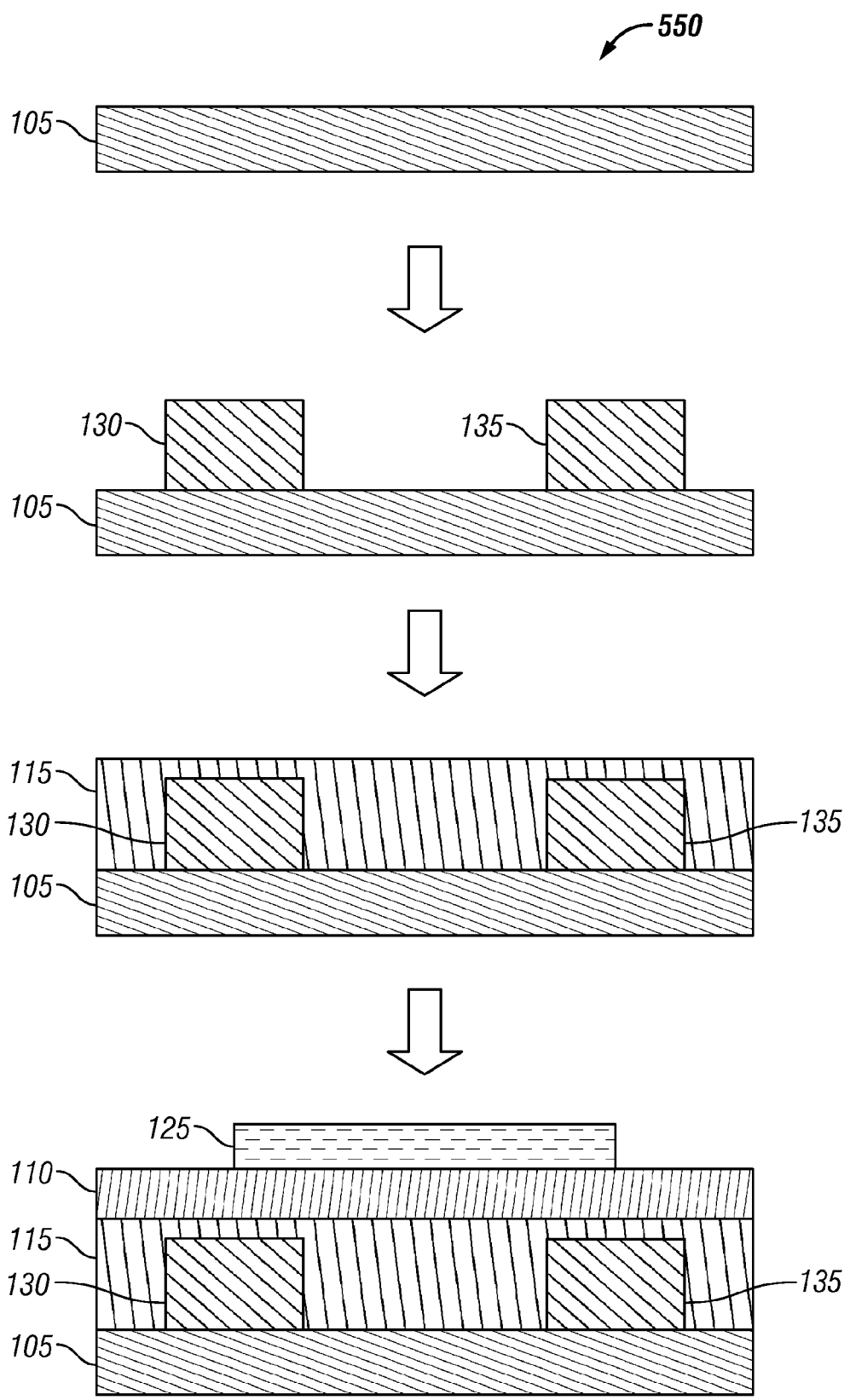
FIG. 9 illustrates a fabrication process associated with the field-effect piezoelectric strain sensor apparatus shown in FIG. 8, in accordance with an embodiment.

The sensor 500 can measure strain through variation of the drain-source current. The gate region 125 either allows the flow of electrons or blocks their passage by creating or eliminating the channel between the source region 130 and the drain region 135. The electrons flow from the source region 130 towards the drain region 135 is influenced by the control voltage applied on gate electrode 125. As mentioned above, the sensor 500 utilizes as substrate 105 which may be a dielectric insulating material. The fabrication process 550 associated with field-effect piezoelectric strain sensor 500 is illustrated in FIG. 9.

Figure 10:
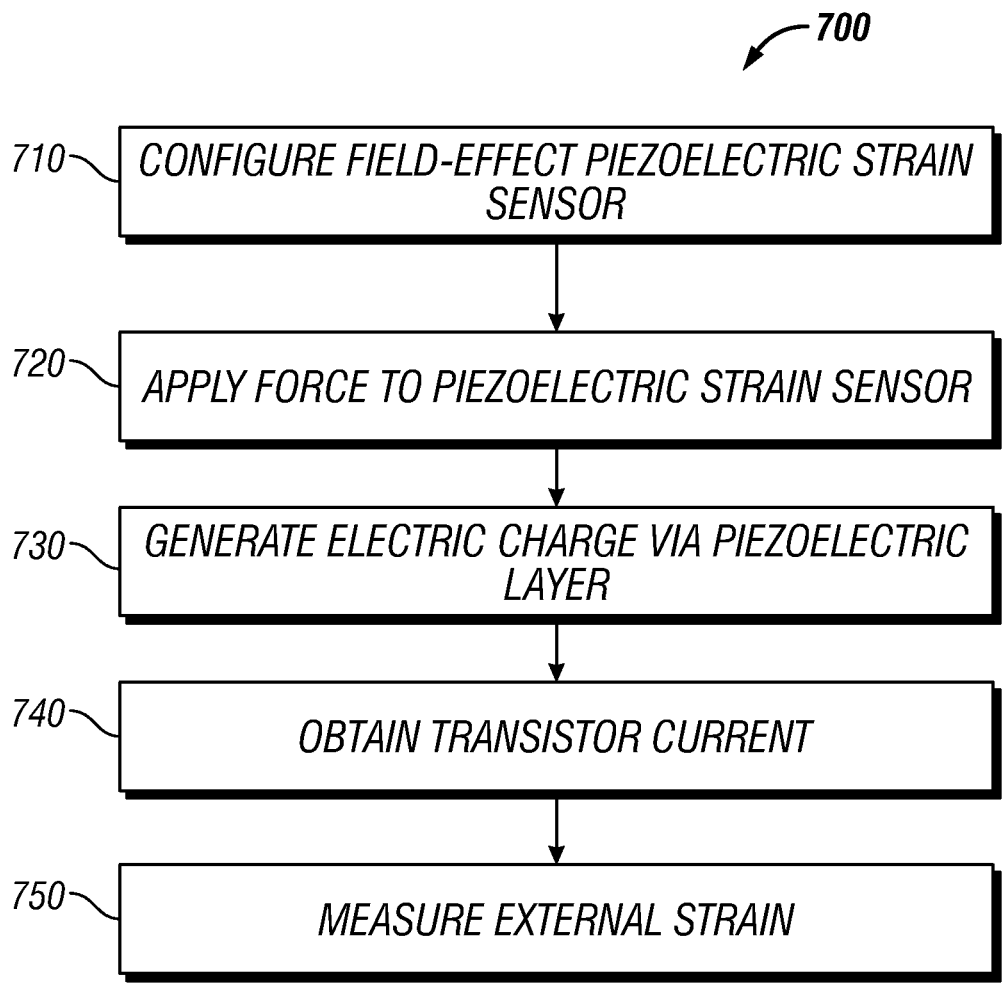
FIG. 10 illustrates a detailed flow chart of operations illustrating logical operational steps of a method for measuring strain via the field-effect piezoelectric strain sensor apparatus, which can be implemented in accordance with an embodiment.

FIG. 10 illustrates a detailed flow chart of operations illustrating logical operational steps of a method 700 for measuring strain via the field-effect piezoelectric strain sensors 100, 300, 400, and 500, in accordance with the disclosed embodiments. The strain sensors 100, 300, 400, and 500 can be configured, as illustrated at block 710. A force can be applied to the strain sensors 100, 300, 400, and 500, as depicted at block 720. The strain is inherently associated with deformation and the strain sensors 100, 300, 400, and 500 can be deformed when a force is acting on it. The strain sensors 100, 300, 400, and 500 can be attached to a structure in such a manner as to undergo the same deformation or a constant portion of that deformation to generate a signal proportional to the strain.

Next, the piezoelectric layer 110 generates an electric charge, as shown at block 730. The strain sensors 100, 300, 400, and 500 offer increased sensitivity and device control due to the presence of the piezoelectric layer 110 in the transistor structure and low cost manufacturability on the large area flexible substrate 105. The strain creates an electrical potential difference in a piezoelectric material. The piezoelectric effect can be found in materials with a specific electrical crystalline structure. The transistor current can thereafter be obtained, as illustrated at block 740. The external strain can be measured, as depicted at block 750.

The sensors 100, 300, 400, and 500 can be readily adapted to a variety of applications and a wide range of operations. For example, the sensors 400 and 500 may also be configured in a metal gateless configuration and electrically operate due primarily to the change in the charge generated by piezoelectricity. Sensors 100, 300, 400, and 500 each also can be configured with a comparatively low cost of construction and can be readily assembled, which presents a low risk of damage to the electronics during assembly or operation. Sensors 100, 300, 400, and 500 are also more accurate and reliable in operation than existing sensors. The strain/pressure/force/vibration changes the transistor current directly; hence, the sensors 100, 300, 400, and 500 require much simpler reading electronics for collecting sensor signals than traditional piezoelectric sensors and consumes less power than such traditional piezoresistive sensors. Additionally, the sensors 100, 300, 400, and 500 offer improved sensitivity due to the presence of the strain/pressure/force/vibration sensitive piezoelectric layer in the metal-piezoelectric-semiconductor thin-film transistor described herein.

Based on the foregoing, it can be appreciated that a strain sensor is disclosed, which includes a flexible substrate and a thin-film transistor structure composed of one or more piezoelectric material layers and a semiconductor layer deposited on the flexible substrate in such a manner that the piezoelectric material layer(s) generates an electric charge resulting in a modulation of a transistor current. A metal gate layer is generally located on the flexible substrate with respect to a source region and a drain region, such that the piezoelectric material layer of the thin-film transistor structure provides for an increased sensitivity and enhanced device control with respect to the strain sensor. As indicated herein, the semiconductor layer may constitute a semiconductor nanowire/nanotube array. The thin-film transistor structure may include a single gate field effect transistor based sensor having the piezoelectric material layer(s) and the metal gate layer located on the same side of the semiconductor layer of the thin-film transistor structure of the single gate field effect sensor.

In some embodiments, the thin-film transistor structure may constitute a dual gate field effect sensor having the piezoelectric material layer(s) included in a structure of the dual gate field effect sensor. The flexible substrate can be composed of a material selected from a material such as, for example, metallic foil, and/or plastic. In some embodiments, piezoelectric material layer may comprise a material such as, for example, a lead zirconate titanate (PZT) film, or an aluminum nitride (AIN) film. The semiconductor layer in some embodiments may constitute a thin film layer that includes a material such as, for example, Si, GaAs, GaN, $SnO_2$, $In_2O_3$, ZnO, InN, and AlInN. The aforementioned semiconductor nanowire/nanotube array may be configured from a material such as, for example, Si, GaAs, GaN, $SnO_2$, $In_2O_3$, ZnO, InN, AlInN, or for example, an array of carbon nanotubes. The piezoelectric material layer and the semiconductor layer can be configured on the flexible substrate utilizing a thin-film deposition technology such as, for example, sputtering deposition. The semiconductor layer may be deposited via a printing technology such as, for example, nanoparticle-based inks. Additionally, a liquid phase of the semiconductor layer comprising $SnO_2$, $In_2O_3$, or ZnO may be prepared utilizing a sol-gel technology and deposited by a printing technology. The nanowire/nanotube array may be deposited on the semiconductor layer utilizing a printing technology. The disclosed sensor may also include a plurality of metal contacts deposited on the flexible substrate utilizing a lithographic and deposition technology or via a printing technology.

Based on the foregoing, it can also be appreciated that in accordance with another embodiment, the strain sensor may be configured from a rigid structure and may include a nanowire/nanotube transistor structure that includes one or more piezoelectric material layers and a semiconductor nanowire/nanotube array deposited on the rigid substrate, such that the piezoelectric layer generates an electric charge resulting in a modulation of a transistor current. Such a sensor may additionally include a metal gate layer located between a source region and a drain region, wherein the piezoelectric layer in the nanowire/nanotube transistor structure provides for an increased sensitivity and enhanced device control with respect to the strain sensor. In such an embodiment, the nanowire/nanotube transistor structure may include a single gate field effect sensor having the piezoelectric material layer (s) included in the structure of the single gate field effect sensor. The nanowire/nanotube transistor structure also may include a dual gate field effect sensor having the piezoelectric material layer(s) included in the dual gate field effect sensor.

It can be appreciated that the disclosed embodiments further include a method of configuring a strain sensor. Such a methodology, or process, includes the step of configuring a flexible substrate (or rigid substrate, depending upon the particular sensor embodiment). An additional process step includes forming a thin-film transistor structure composed of one or more piezoelectric material layer(s) and a semiconductor layer. A step may also be implemented in which the thin-film transistor structure is deposited on the substrate such that the piezoelectric layer generates an electric charge resulting in a modulation of a transistor current. Additional processing steps may include locating a metal gate layer on the flexible substrate with respect to a source region and a drain region, wherein the piezoelectric material layer(s) of the thin-film transistor structure provides for an increased sensitivity and enhanced device control with respect to the strain sensor.

The disclosed methodology may also include a step of configuring the semiconductor layer to comprise a semiconductor nanowire/nanotube array and/or configuring the thin-film transistor structure to comprise a single gate field effect sensor with a piezoelectric layer included in a structure of the single gate field effect sensor, wherein the piezoelectric material layer and the metal gate layer are located on the same side of the semiconductor layer.

Based on the foregoing, it can be appreciated that a field effect strain sensing apparatus and method of forming the same are disclosed herein, including variations thereof. In some embodiments, such an apparatus can include a piezoelectric layer fixed to a semiconductor layer forming a thin-film transistor structure. A metallic gate layer is also generally fixed to an isolator layer mounted on said semiconductor layer, said metallic gate layer serving as a gate of a transistor. Additionally, a source layer and a drain layer can be fixed to said semiconductor layer, said source layer serving as a source of said transistor and said drain layer serving as a drain of said transistor. Also, a flexible substrate can be mounted to said thin-film transistor structure, such that a current condition between said source layer and said drain layer is controlled by a gate voltage applied at said gate layer and is further modulated by a strain in said piezoelectric layer and said isolator layer, thereby permitting said field effect strain sensing apparatus to sense strain, force, vibration, and pressure on said flexible substrate.

In an alternative embodiment, the said semiconductor layer can be configured as a nanowire or as a nanotube array. In still other embodiments, the isolator layer can be configured from a piezoelectric material. The substrate can also be configured in some embodiments as a metal foil and the semiconductor layer can be configured from one or more of the following types of materials: Si, $SnO_2$, $In_2O_3$, ZnO, InN, AlInN. In still other embodiments, the aforementioned substrate can be configured as a metal foil and the semiconductor layer can be configured as a nanowire or as a nanotube array formed from one or more of the following types of materials: Si, $SnO_2$, $In_2O_3$, ZnO, InN, AlInN, and Carbon nanotubes.

In yet other embodiments, the substrate can be configured from a plastic material and the semiconductor layer can be configured from one or more of the following types of materials: Si, $SnO_2$, $In_2O_3$, ZnO, InN, and AlInN. In still other embodiments, the dielectric layer can be configured from a piezoelectric material, the substrate can be configured from a plastic material, and the semiconductor layer can be configured as a nanowire or as a nanotube array formed from at least one of the following types of materials: Si, $SnO_2$, $In_2O_3$, ZnO, InN, AlInN, and Carbon nanotubes.

It will be appreciated that variations of the above-disclosed and other features and functions, or alternatives thereof, may be desirably combined into many other different systems or applications. It will also be appreciated, that various presently unforeseen or unanticipated alternatives, modifications, variations, or improvements therein may be subsequently made by those skilled in the art which are also intended to be encompassed by the following claims.

What is claimed is:

1. A strain sensor, comprising:
   a flexible substrate;
   a thin-film transistor structure comprising at least one piezoelectric material layer formed below a semiconductor layer and deposited on said flexible substrate, wherein said at least one piezoelectric material layer generates an electric charge resulting in a modulation of a transistor current;
   a metal gate layer located on said flexible substrate with respect to a source region and a drain region, wherein said at least one piezoelectric material layer of said thin-film transistor structure provides for an increased sensitivity and enhanced device control with respect to said strain sensor; and
   wherein said thin-film transistor structure comprises a dual gate field effect sensor having said semiconductor layer sandwiched above said at least one piezoelectric material layer and below a second piezoelectric layer included in a structure of said dual gate field effect sensor wherein at least one channel region of said semiconductor layer is modulated by strain in said at least one piezoelectric material layer and said second piezoelectric layer.

2. The sensor of claim 1 wherein said semiconductor layer comprises a semiconductor carbon nanotube array.

3. The sensor of claim 2 wherein said semiconductor carbon nanotube array comprises a material selected from a group of materials comprising at least one of the following types of materials:
   GaAs;
   GaN;
   SnO2;
   In2O3;
   ZnO;
   InN;
   AlInN; and
   an array of carbon nanotubes.

4. The sensor of claim 2 wherein said carbon nanotube array is deposited on said semiconductor layer utilizing a printing technology.

5. The sensor of claim 2 wherein said at least one piezoelectric material layer and said semiconductor layer are configured on said flexible substrate utilizing a thin-film deposition technology.

6. The sensor of claim 1 wherein said flexible substrate comprises a material selected from a group of materials comprising at least one of the following types of materials:
   a metallic foil.

7. The sensor of claim 1 wherein said at least one piezoelectric material layer comprises a material selected from a group of materials comprising at least one of the following types of materials:
   lead zirconate titanate (PZT) film; and
   aluminum nitride (AlN) film.

8. The sensor of claim 1 wherein said semiconductor layer comprises a thin film layer that includes a material selected from a group of materials comprising at least one of the following types of materials:
   GaAs;
   GaN;
   SnO2;
   In2O3;
   ZnO;
   InN; and
   AlInN.

9. The sensor from claim 8 wherein said semiconductor layer is deposited via a printing technology utilizing nanoparticle-based inks.

10. The sensor from claim 8, wherein a liquid phase of said semiconductor layer comprising SnO2 or In2O3 is prepared utilizing a sol-gel technology and deposited by a printing technology.

11. The sensor of claim 1 wherein said at least one piezoelectric material layer and said semiconductor layer are configured on said flexible substrate utilizing a thin-film deposition technology.

12. The sensor of claim 11 wherein said thin-film deposition technology comprises a sputtering deposition.

13. The sensor of claim 1 further comprising a plurality of metal contacts deposited on said flexible substrate utilizing a printing technology.

14. A strain sensor, comprising:
   a rigid substrate;

a nanowire/nanotube transistor structure comprising at least one piezoelectric material layer formed below a semiconductor carbon nanotube array and deposited on said substrate, wherein said piezoelectric layer generates an electric charge resulting in a modulation of a transistor current;

a metal gate layer located between a source region and a drain region, wherein said piezoelectric layer in said carbon nanotube transistor structure provides for an increased sensitivity and enhanced device control with respect to said strain sensor; and wherein said nanowire/nanotube transistor structure comprises a dual gate field effect sensor having said semiconductor layer sandwiched above said at least one piezoelectric material layer and below a second piezoelectric layer included in said dual gate field effect sensor wherein at least one channel region of said semiconductor layer is modulated by strain in said at least one piezoelectric material layer and said second piezoelectric layer.

* * * * *